United States Patent [19]
Molyneaux et al.

[11] Patent Number: 5,510,711
[45] Date of Patent: Apr. 23, 1996

[54] DIGITAL COMBINATION AND CORRECTION OF QUADRATURE MAGNETIC RESONANCE RECEIVER COILS

[75] Inventors: David A. Molyneaux, Willowick; Haiying Liu, Euclid, both of Ohio

[73] Assignee: Picker International, Inc., Highland Hts., Ohio

[21] Appl. No.: 286,758

[22] Filed: Aug. 5, 1994

[51] Int. Cl.$^6$ .................................................. G01R 33/48
[52] U.S. Cl. .......................................... 324/309; 324/307
[58] Field of Search .................................. 324/300, 307, 324/309, 314, 318, 322; 128/653.2, 653.5

[56] References Cited

U.S. PATENT DOCUMENTS

| | | | |
|---|---|---|---|
| 4,611,172 | 9/1986 | Takase | 324/309 |
| 4,706,027 | 11/1987 | Hughes | 324/309 |
| 4,734,648 | 3/1988 | Machida et al. | 324/322 |
| 4,763,074 | 8/1988 | Fox | 324/322 |
| 4,766,377 | 8/1988 | Ohuchi et al. | 324/307 |
| 4,780,675 | 10/1988 | DeMeester et al. | 324/309 |
| 4,825,162 | 4/1989 | Roemer et al. | 324/318 |
| 4,851,779 | 7/1989 | DeMeester et al. | 324/309 |
| 4,879,516 | 11/1989 | Mehdizadeh et al. | 324/318 |
| 4,918,388 | 4/1990 | Mehdizadeh et al. | 324/322 |
| 4,947,121 | 8/1990 | Hayes | 324/322 |
| 5,394,087 | 2/1995 | Molyneaux | 324/318 |

FOREIGN PATENT DOCUMENTS

| | | |
|---|---|---|
| 234786A2 | 9/1987 | European Pat. Off. . |
| 411840A2 | 2/1991 | European Pat. Off. . |
| 608426A1 | 10/1992 | European Pat. Off. . |
| WO93/03393 | 2/1993 | WIPO . |

OTHER PUBLICATIONS

"Quadrature Multiplexed RF Excitation in NMR Imaging—Application to Slice By Slice and Chunk 3-D Techniques", Ra, et al., IEEE Trans. on Nuclear Science, V. 33, No. 1, (Feb. 1986) pp. 575–578.

"Digital Combination of Asymmetric Quadrature Coils", Molyneaux, et al. Proceedings of the SMRM, 12th Annual Scientific Meeting, vol. 1, (Aug. 1993).

"Monitoring Quadrature Phase Error and Gain Mismatch Using Noise", Suits, et al., J. Mag. Res. Series A, 108 (1994 Jun.), No. 2, pp. 230–233.

"Sample–Induced Cross–Coil Coupling, Implications for Magnetic–Resonance–Imaging Quadrature Coils", Harpen, J. Mag. Res. 94 (1991 Sep.), No. 2 pp. 309–316.

*Primary Examiner*—Sandra L. O'Shea
*Assistant Examiner*—Raymond Y. Mah
*Attorney, Agent, or Firm*—Fay, Sharpe, Beall, Fagan, Minnich & McKee

[57] ABSTRACT

Magnetic resonance is excited in selected portions of a subject disposed within a temporally uniform magnetic field of a magnetic resonance imaging system. A quadrature coil assembly (30) receives radio frequency magnetic resonance signals from the subject. Commonly, the quadrature coil fails to receive signals in true quadrature over the entire examination region. Resonance signals from a first coil (32) and a second, orthogonal coil (34) are received (40, 42), digitized (44, 46), and Fourier transformed (50, 52) into complex images. Each complex image includes an array or grid of vector data values having a magnitude and a direction or phase angle. If the quadrature coil was truly quadrature over the entire region of interest, the data values of both complex images would be a unit vectors. The vector of one image would be offset by 90° from the vectors of the other. A phase correction board (54) sets the phase angle of the corresponding data values of the first and second complex images to a common vector direction or phase angle. A magnitude correction board (56) adjusts the magnitude of each corresponding data value of the first and second complex images. The phase angle and magnitude corrected complex data images are summed (58) and the real or magnitude image is stored in an image memory (62).

17 Claims, 4 Drawing Sheets

DIGITAL COMBINATION AND CORRECTION OF QUADRATURE MAGNETIC RESONANCE RECEIVER COILS

BACKGROUND OF THE INVENTION

The present invention relates to correction and normalization techniques for signals from a radio frequency receiver coil of magnetic resonance scanners. This invention finds particular application in conjunction with image data correction techniques for signals from "quadrature" receiving coils which are not, in fact, in quadrature over their entire field of view and will be described with particular reference thereto.

Heretofore, various "quadrature" coils have been utilized with magnetic resonance imaging and spectroscopy equipment. The quadrature coils typically include two coils or coil arrays which view the same region of interest, but are sensitive to signals 90° out of phase. Signals from the two coils are connected to an analog phase shifting circuit which causes both signals to have the same phase. Typically, the analog phase shifting circuit is an LC circuit which advances the phase of the lagging signal by 45° and retards the phase of the leading signal by 45° such that the two phases match. Once the phases match, the signals are summed, providing a signal to noise improvement of the $\sqrt{2}$.

More mathematically stated, when two signals and $S_2$ are combined, the resultant signal $S_a$ is defined by:

$$S_a = \sqrt{\frac{1}{2} (S_1^2 + S_2^2 + 2S_1 S_2 \sin\alpha)} \qquad (1)$$

where $\alpha$ is the phase difference between the two signals. It is readily apparent that $S_a$ is maximized when $\alpha=90°$ and $S_1$ and $S_2$ are equal, i.e., a true quadrature relationship. It will further be noticed that as the phase angle $\alpha$ between the signals approaches zero, the advantages of summing disappear. Moreover, as the magnitude of the signals differ, summing the two components can actually become disadvantageous.

Typically, fully circularly symmetric coils, like a birdcage coil, are in quadrature over substantially the entire region of interest. However, other coils, such as planar coils, tend to only have a plane of symmetry along which the signals received by the two coils are orthogonal. Signals from off the plane of symmetry tend to lose their orthogonality with distance from the plane of symmetry. Moreover, the intensity or relative magnitude of the signals received by the two coils from points in space differ over the field of view. When these signals are combined with a conventional analog combiner, signals originating along the line of symmetry show good intensity and signal-to-noise improvement. However, signal sources off the plane of symmetry tend to show less advantage with deviation from the plane of symmetry.

Phase angle deviations in the signals received by different coils has also proven a problem in phased array coils. In phased array coils, a plurality of coils are disposed in a line with only small regions of overlap to image an enlarged area. Image portions are combined at the regions of overlap to produce an image that is larger than the field of view of any individual coil. Phase variations at the regions of overlap tend to cause discontinuities in the image of the entire field of interest. In order to combine these images from linear coils with adjacent, slightly lapping fields of view, weighted magnitude images have been combined using a noise resistance matrix. Such image adjustment is, of course, performed after magnitude reconstruction. See, for example, U.S. Pat. No. 4,825,162.

U.S. Pat. No. 4,947,121 describes a technique for combining signals from receiver coils using noise data samples and creating a noise matrix. These noise matrix techniques require additional scan time in order to acquire data for the noise matrix. Moreover, these techniques assume that the noise values of the two coils correctly described the signal phase and magnitude deviations. When the anatomy to be imaged can affect the coil signal pattern, the signal phase and magnitude vary differently from the noise pattern with position in the field of view. Moreover, these techniques are directed to coil arrays with adjacent fields of view, not quadrature coils.

The present invention provides a new and improved quadrature signal correction technique which overcomes the above-referenced problems and others.

SUMMARY OF THE INVENTION

In accordance with the present invention, a method and apparatus are provided for normalizing the phase and/or the magnitude of quadrature resonance signals in the complex image domain prior to combining the signals to produce an image in the magnitude domain.

In accordance with a more limited aspect of the present invention, the two signals from a quadrature coil are digitized and Fourier transformed to produce data sets in the complex domain. The phase of the complex domain data is corrected or normalized such that corresponding data values of both complex domain sets have the same phase.

Similarly, the magnitude of the corresponding complex domain data sets are normalized or corrected such that the corresponding data values have the same signal magnitude.

In accordance with a yet more limited aspect of the present invention, the phase of the complex domain data is unwrapped to eliminate phase discontinuities. The phase of both components are normalized to a common phase value. The image magnitudes are analogously normalized to a common signal strength value.

In accordance with another more limited aspect of the present invention, phase and magnitude look-up tables are provided. The look-up tables are pre-programmed in accordance with the geometry of the quadrature coil. The values of the look-up table may be either calculated theoretically or based on actual measurements of the phase and magnitude or signal strength variations across the field of view. Each signal is then corrected in accordance with the look-up tables to produce signals with common phase angles and signal strengths for summing to produce the image.

In accordance with another more limited aspect of the present invention, the phase of the two signals is unwrapped to determine the relative phase of each signal component. The difference in the two phase angles is used to adjust the phase of a second of the signals such that the second signal has the same phase as the first signal. In this manner, the phase is adjusted dynamically such that each component has the same phase as the other at each point in the field of view. The magnitude is corrected analogously by using one of the above-described magnitude correction and normalization techniques.

One advantage of the present invention is that it improves signal strength uniformly, even from regions of the field of view at which the two components of the "quadrature" coil are not truly quadrature.

Another advantage of the present invention is that it does not require the computing of noise resistance matrices.

Another advantage of the present invention is that when a matrix is utilized, phase correction and magnitude of correction are applied to the signal matrix only.

Another advantage of the present invention is that it is independent of any correlation between the noise data from the two halves of the quadrature coil because both coils see the same field of view and have minimal mutual inductance.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
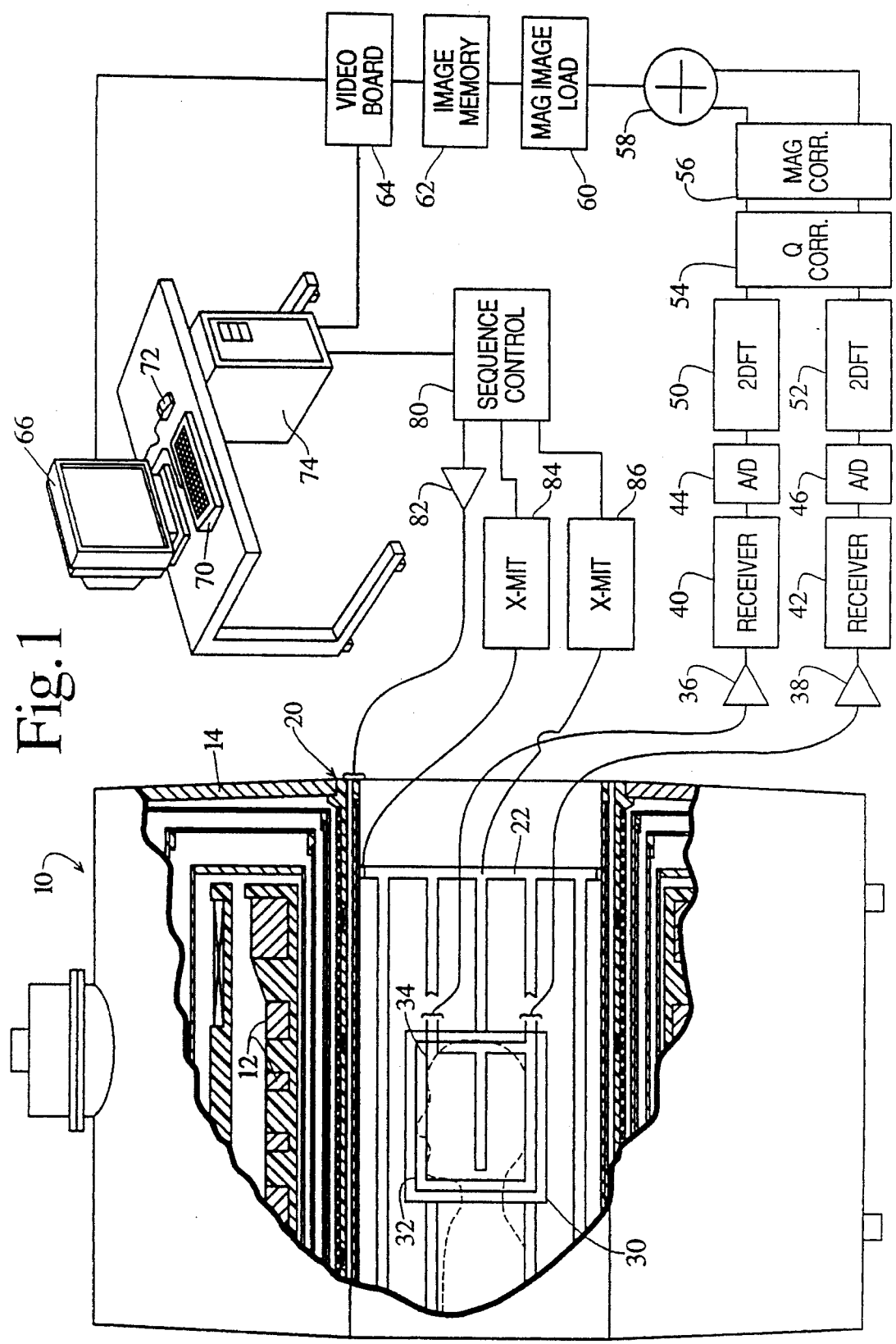
FIG. 1 is a diagrammatic illustration of a magnetic resonance imaging system in accordance with the present invention.

With reference to FIG. 1, a magnet assembly 10 generates a temporally constant magnetic field through an examination region. In the preferred embodiment, the magnet is superconducting and has toroidal coils 12 disposed in a vacuum dewar 14. The examination region is defined in a central bore 16 of the vacuum dewar.

A self-shielded, whole-body gradient coil 20 and a whole-body radio frequency coil 22 extend peripherally around the patient receiving bore 16.

An insertable, quadrature radio frequency coil 30 includes a planar loop coil 32 and a Helmholtz pair 34 which are primarily sensitive to orthogonal and parallel radio frequency components within its field of view. On a central plane of symmetry, the signals received by the two coils have a substantially 90° phase relationship. However, the phase relationship deteriorates with displacement from the central plane of symmetry. Optionally, insertable planar gradient coils (not shown) may be connected with the insertable radio frequency coil 30.

The loop and flat Helmholtz coils are connected with a pair of amplifiers 36, 38. The amplified received resonance signals are conveyed to digital receivers 40, 42 which demodulate the signals. Analog-to-digital converters 44, 46, which are preferably incorporated into the receivers 40, 42, generate digital, raw, complex magnetic resonance signals.

Array processors 50, 52 perform a two or three-dimensional inverse Fourier transform on the digital resonance signals, each generating a two-dimensional complex image. The complex images each have an array or grid of complex vector data values. Each data value has a magnitude value and a phase angle value, i.e., real and imaginary components for each pixel or voxel of the field of view. A digital phase correction means 54 includes circuitry, firmware, software, or the like for adjusting the phase angle of the complex image data values such that the phase angle of the corresponding data values (data values corresponding to the same voxel of the field of view) is rotated into coincidence. A magnitude correction or normalization means 56 includes circuitry, firmware, software, and the like for adjusting the magnitude values. In particular, the response of each coil is non-uniform. A signal source of unit intensity appears strong in some regions of the field of view and weaker in others. The magnitude correction means scales the magnitude value to compensate for this non-uniform response. A complex image adder 58 sums the two complex images corresponding data value by corresponding data value to generate a combined complex image representation. A magnitude image loading means 60 loads a magnitude image made up of the magnitude components of each data value into an image memory 62. A video board 64 selects magnitude image data from the image memory to generate two-dimensional human-readable display on a video monitor 66.

An operator using keyboard 70 and mouse 72 controls a workstation computer 74 which causes the video board 64 to withdraw selected planes of image data, generate three-dimensional renderings, create cut plane images, and the like.

The workstation computer 74 also controls a magnetic resonance sequence controller 80 which controls the implementation of a selected one of a multiplicity of magnetic resonance imaging sequences. The sequence controller 80 causes current amplifiers 82 to send current pulses to the gradient coils 20 or insertable gradient coils for generating the magnetic field gradient pulses of the selected magnetic resonance sequence. A pair of digital transmitters 84, 86 generate radio frequency pulses under the control of the sequence controller to cause the quadrature coils 22 to emit radio frequency magnetic resonance excitation and manipulation signals. Alternately, the transmitters can be connected with the insertable radio frequency coil 30.

Figure 2:
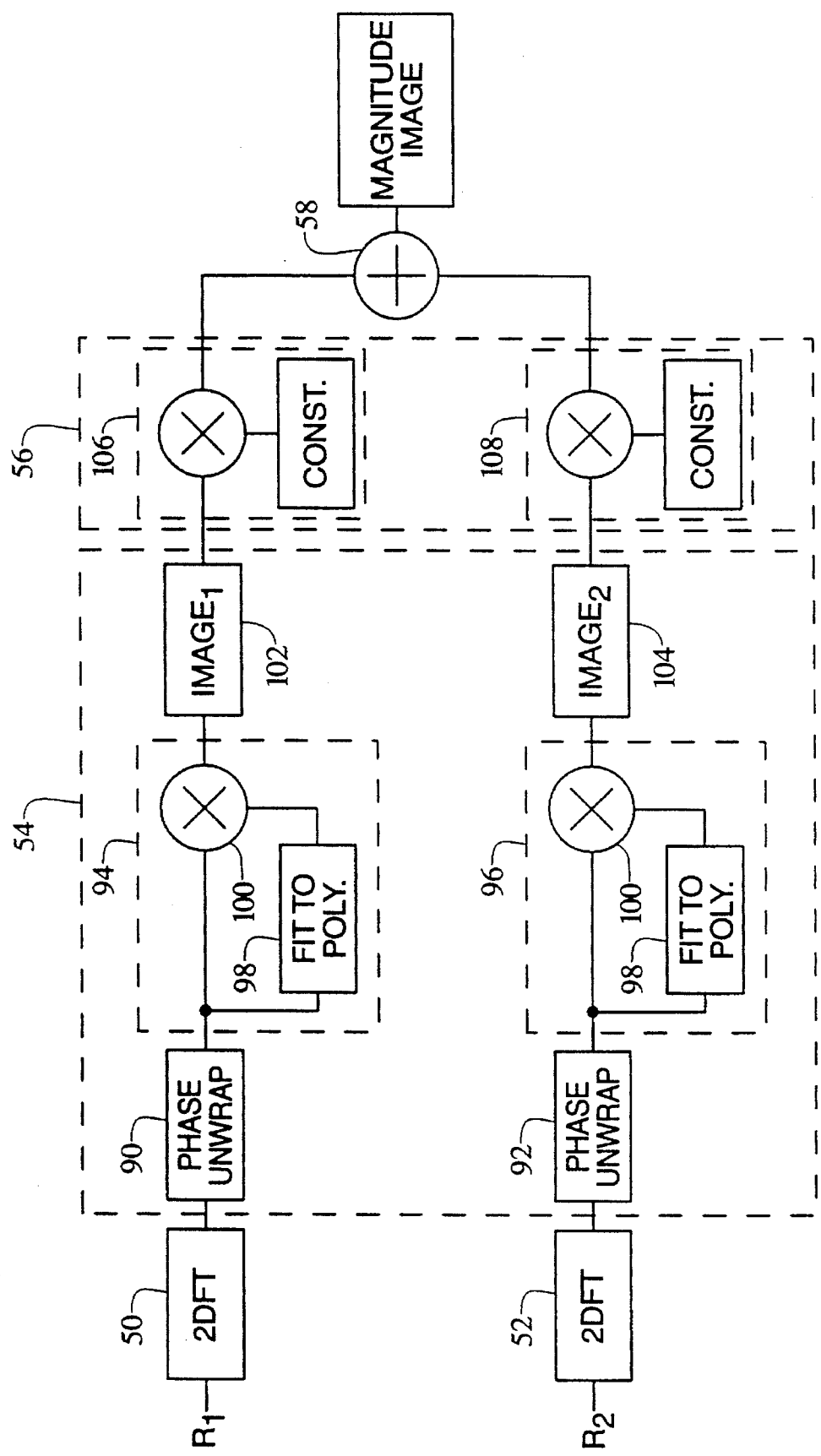
FIG. 2 illustrates one preferred phase and magnitude correction embodiment of the present invention.

With reference to FIG. 2, the signal from each of the coils 32, 34 is digitized into the raw complex image data $R_1$ and $R_2$ and supplied to the array processors 50, 52 to be Fourier transformed. A phase unwrap algorithm 90, 92 is applied to each data value to remove $2\pi$ phase discontinuities. That is, phase discontinuities in the signals are corrected. Phase correction or normalization algorithms 94, 96 implemented in hardware or software fit the data values of each the phase discontinuity corrected complex image to a two-dimensional polynomial using a least squares fit 98 to generate a complex unitary vector array. The complex unitary vector array and data values of the phase unwrapped complex image are multiplied 100 to create data values of a phase angle normalized complex image. In this manner, every data value in the first and second complex images has its phase angle normalized to the same phase angle. The phase corrected complex images are stored in memories or buffers 102, 104. The magnitude of the phase corrected signals is scaled 106, 108 to a normalized value by multiplying by constants. The data values is then summed 58 in the complex domain and reconstructed into a single magnitude image for display.

Figure 3:
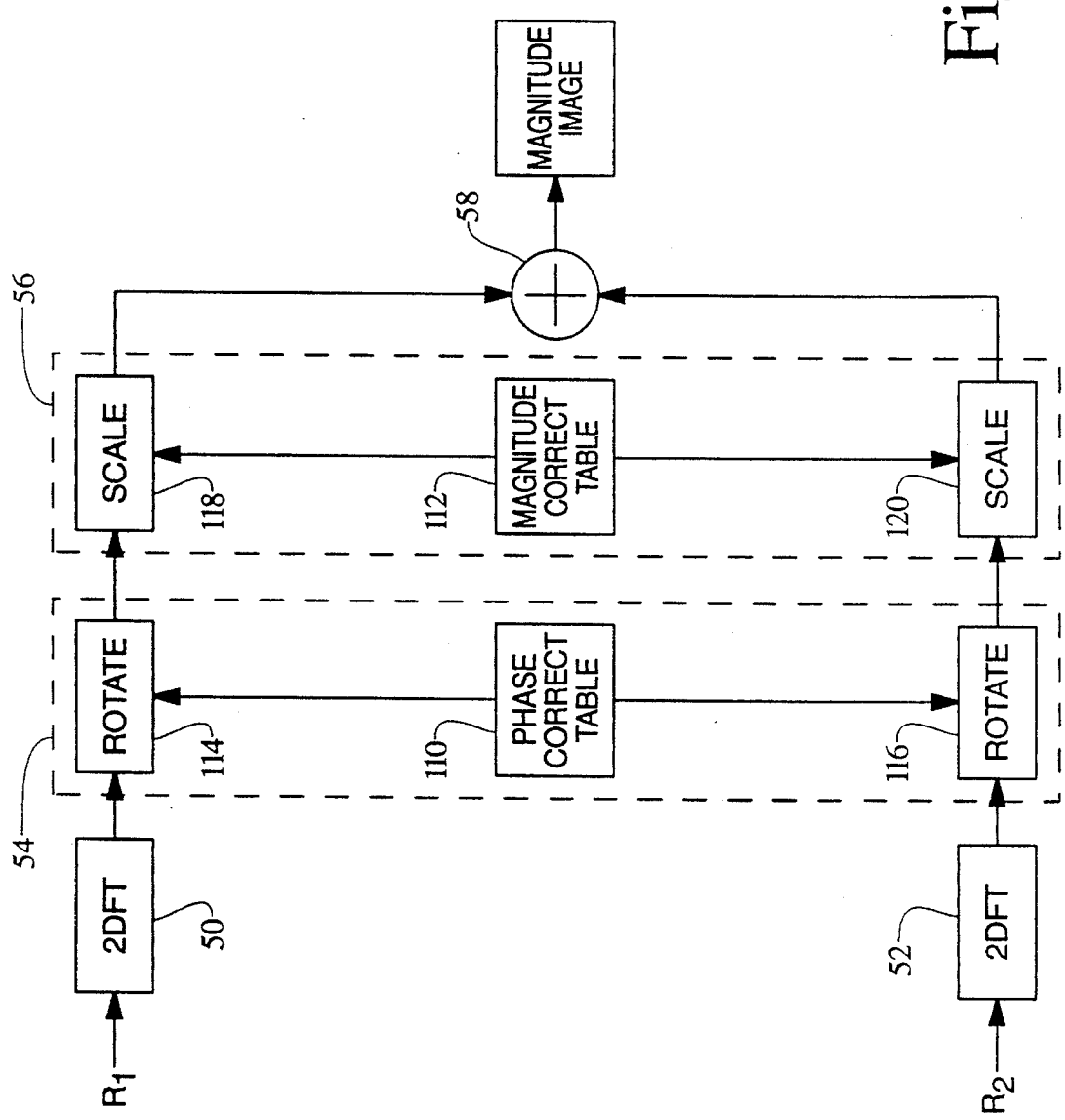
FIG. 3 illustrates another preferred phase and magnitude correction technique in accordance with the present invention; and, FIG. 4 illustrates yet another preferred embodiment of the present invention.

With reference to FIG. 3, field pattern equations for the phase angle and magnitude are derived from the conductor pattern of each coil of the quadrature coil assembly and stored in a phase correction look-up table 110 and a magnitude correction look-up table 112, respectively. The signal from each coil is again digitized into raw complex image data and Fourier transformed. The phase correction table 110 is then used to rotate or normalize 114, 116 the phase angle of each signal to a common angle. The magnitude correction 112 table is used to scale or normalize 118, 120 the magnitude of each signal. When the phase and magnitude maps stored in the tables 110, 112 are physically displaced from the coordinate system of the data, an appropriate shift in the data or table values is performed. The phase and magnitude corrected complex images are summed 58 and reconstructed into the magnitude image for display.

Figure 4:
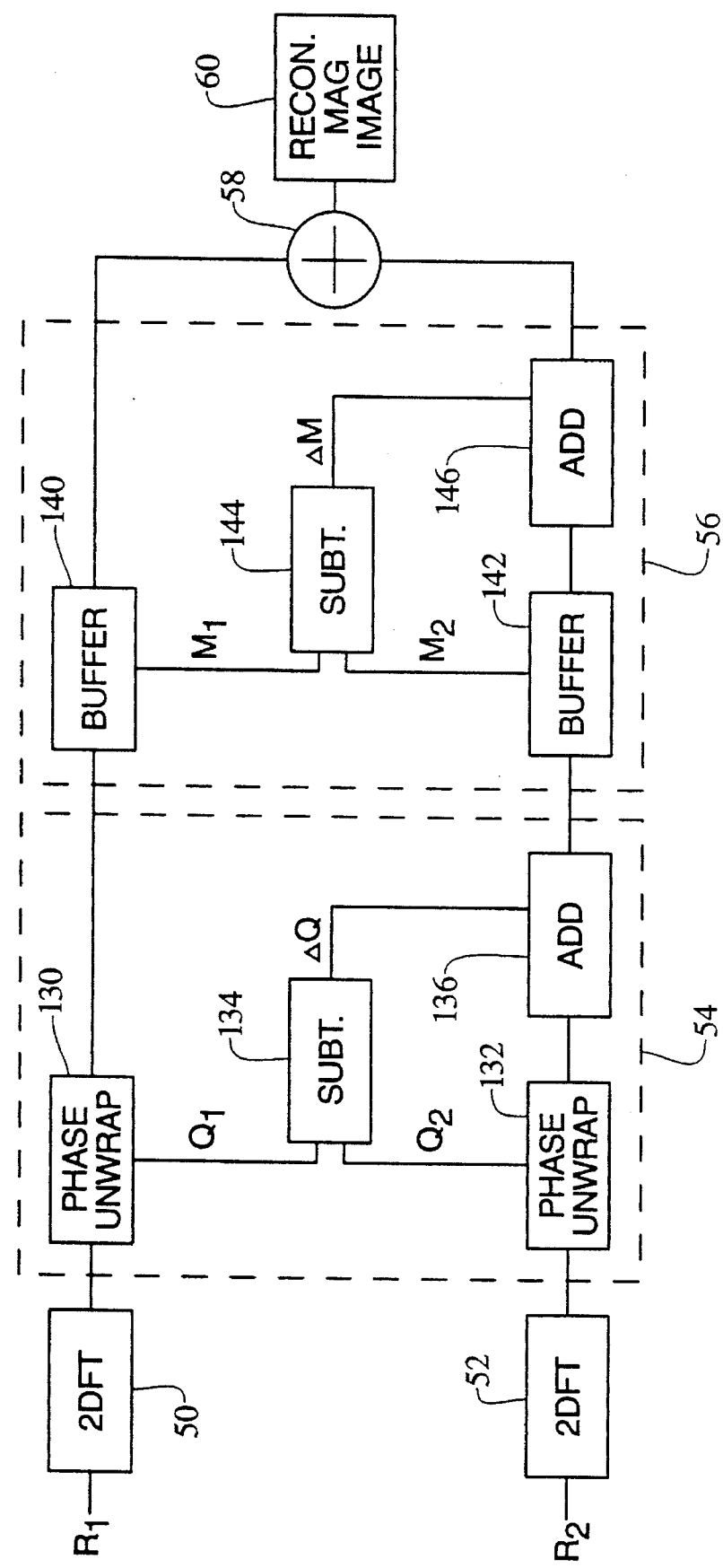

The phase and magnitude correction technique of FIG. 4 relies only on the image data itself. Accordingly, it can be applied to any quadrature pair, symmetric or asymmetric, without a priori information about the coil. Rather than normalizing the phase angle and magnitude or signal strength to a common value for each data point, only the phase angle and magnitude of one data value of one complex image is set to the same phase angle and magnitude as the other complex image. The signal from each coil is again digitized into raw complex image data and Fourier transformed. Phase unwrap algorithms 130, 132 are applied to each set of raw data to create phase angle values $\phi_1$, $\phi_2$ with no discontinuities. A phase subtraction means 134 subtracts the phase angle value of one data value from the corresponding phase angle value of the other complex image to determine a phase angle difference $\Delta\phi$. This phase angle difference is then added 136 to one of the data values to rotate it into alignment with the corresponding data value of the other complex image. In this manner, both components are given the same phase. This process is repeated for each pair of corresponding data values. Each data value may be normalized to a different phase angle or direction than the preceding data values. Buffer memories 140, 142 store the phase angle corrected images. The phase corrected images are then conveyed to magnitude normalizing means 56 which normalize the magnitude of the signals. The signals can be normalized using one of the normalization techniques described above. Alternately, the magnitude components $M_1$, $M_2$ of each corresponding pair of data is subtracted to create a magnitude difference $\Delta M$. The difference is added 146 to the magnitude value of one of the components. The magnitude signals are added 58 and reconstructed 60 into a single magnitude image for display. Note that the magnitude image reconstruction means 60 in this embodiment further adjusts each data value of the magnitude image to account for the variations of phase angle or direction of the data values of the complex image sum.

Various alternate embodiments immediately present themselves. For example, rather than using a point by point scheme as described above, a region by region phase and magnitude adjustment may be utilized. This technique defines multiple points as a region and processes all the points within the region with a common correction. As another alternative, only the phase or the magnitude might be corrected. As another alternative, the technique can be used to cancel rather than enhance selected signal components. For example, the raw data can be analyzed to determine the tissue type which it represents by comparing the individual data values to various thresholds. If the tissue is of a type which detracts from the resultant image, the phase correction can set the phase angle of the two components 180° apart such that the two data values cancel rather than enhancing. Analogously, the magnitude normalization technique could be modified to subtract rather than add signals in selected regions. This technique can also be expanded to multiple quadrature coils in an array topology. Conventional techniques for geometric distortion correction, main field distortion correction, radio frequency linearity correction, and the like can be combined into the present processing technique, either by separate steps, or where appropriate, combined into the look-up tables. System imbalances such as preamplifier gain, multiplexer gain, receiver channel gain, and the like can be corrected by using an additional constant multiplied by the individual image data set prior to combination. The user interface can be used to select regions of primary interest for enhancement. The described corrections can be hard-coded into hardware chips for high-speed processing to accommodate the rapid flow of data in a magnetic resonance imaging system or could be performed after image data collection using post-processing software. The look-up tables of the FIG. 3 embodiment can also contain information about how the anatomy is to be imaged and the affect of the field pattern and how to compensate for its affect. In the embodiment of FIG. 4, a low pass filter could be applied to the raw data to smooth the phase data and then recombine it with the original phase data for each channel.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance method in which a subject is disposed in a temporally constant magnetic field and magnetic resonance signals from the subject are received by a receive coil assembly which has a first coil and an orthogonal coil which lack a true quadrature relationship over a field of view of the receive coil assembly, the improvement comprising:

separately receiving resonance signals from the first coil and the orthogonal coil of the receive coil assembly;

transforming the resonance signals from the first coil to generate a first complex domain image including an array of vector data values each having a magnitude and a phase angle and the resonance signal from the orthogonal coil to generate a second complex domain image including an array of vector data values each having a magnitude and a phase angle;

normalizing at least one of phase angle and magnitude of corresponding data values of the first and second complex domain images;

combining the normalized first and second complex domain images; and, producing a magnitude domain image from the combined complex domain images.

2. In a magnetic resonance system in which a subject is disposed in a temporally constant magnetic field and magnetic resonance signals from the subject are received by a quadrature coil assembly including first and second coils which lack a true quadrature relationship over their mutual field of view, the improvement comprising:

a transforming means for transforming the resonance signals received by the first coil into a first complex domain image including a first array of vector values each having a magnitude and a direction and for transforming resonance signals received by the second coil into a second complex image including a second array of vector values each having a magnitude and a direction;

a normalizing means for normalizing at least one of the magnitude and the direction of corresponding vector values of the first and second complex domain images;

an image adder for combining corresponding vector values of the first and second complex domain images; and, a display means for converting magnitudes of the combined vector values of the combined first and second complex domain images into a human-readable magnitude display.

3. A magnetic resonance imaging apparatus comprising:

magnets for generating a temporally constant magnetic field through an examination region;

gradient coils and current amplifiers for generating magnetic field gradient pulses across the examination region;

a quadrature radio frequency coil assembly for receiving magnetic resonance signals from the examination region, the quadrature coil assembly including a first coil and a second coil which have variations in the relative phase angle and signal strength of signals received from various points within the examination region;

a pair of receivers each connected with one of the first and second coils for demodulating radio frequency magnetic resonance signals therefrom and analog-to-digital converters for digitizing the demodulated magnetic resonance signals into raw, complex data signals;

array processors for separately inversely Fourier transforming the raw data signals from the first and second coils into first and second complex images, each complex image including an array of data values;

a phase correction means for adjusting a phase angle of individual data values of the first and second complex images such that corresponding data values in both complex images have a common phase angle;

an adder for adding the corresponding data values of the phase angle adjusted complex images to form a combined image;

an image memory for storing a magnitude image derived from the combined complex image;

a monitor for converting the magnitude image into a human-readable display.

4. The magnetic resonance imaging system as set forth in claim 3 wherein the phase correction means includes a phase unwrapping means for correcting each of the data values of the first and second complex images for $2\pi$ phase discontinuities.

5. The magnetic resonance imaging system as set forth in claim 4 wherein the phase correction means further includes:

a means for fitting the phase discontinuity corrected data values to a two-dimensional polynomial to create a complex unitary vector array;

a multiplier for multiplying the complex unitary vector array and a corresponding one of the phase discontinuity corrected complex images together to obtain a normalized complex image whose data values have a common, normalized phase.

6. The magnetic resonance imaging system as set forth in claim 4 wherein each data value includes a phase angle value and a magnitude value and the phase correction means further includes:

a phase subtraction means for subtracting the phase angle values of corresponding data values of the first and second complex images to obtain a phase angle differences; and, a phase adjusting means for adjusting the phase angle values of one of the first and second complex images in accordance with the phase angle differences such that the phase angle values of the corresponding data values of the first and second complex images have a common phase angle value.

7. The magnetic resonance imaging system as set forth in claim 3 wherein each data value includes a phase angle value and a magnitude value and the phase correction means includes:

a phase correction look-up table preprogrammed in accordance with phase angle deviations of the first and second coils across the examination region; and a means for adjusting each phase angle value of at least one of the first and second complex image representations in accordance with the look-up table.

8. The magnetic resonance imaging system as set forth in claim 7 further including a magnitude correction means for correcting the magnitude value of at least one of each of the corresponding data values of the first and second complex images.

9. The magnetic resonance imaging system as set forth in claim 8 wherein the magnitude correction means includes:

a magnitude correction look-up table preprogrammed in accordance with magnitude deviations of the first and second coils across the examination region; and, a multiplier for adjusting the magnitude value of at least one of the corresponding data values of the first and second complex images in accordance with the magnitude deviations.

10. The magnetic resonance imaging system as set forth in claim 3 wherein each data value includes a phase angle value and a magnitude value and further including a magnitude correction means which normalizes the magnitude values of the first and second complex images.

11. A magnetic resonance imaging method comprising:

generating a temporally constant magnetic field through an examination region;

generating magnetic field gradient pulses across the examination region;

receiving magnetic resonance signals from the examination region with a first coil and a second coil which have variations in the relative phase angle and signal strength of signals received from various points within the examination region;

demodulating and digitizing radio frequency magnetic resonance signals received by the first and second coils to generate first and second raw, complex data signals;

separately inversely Fourier transforming the first and second raw data signals into first and second complex images, each complex image including an array of data values, each data value having a phase angle value and a magnitude;

adjusting at least one of the phase angle value and the magnitude of each pair of corresponding data values of the first and second complex images such that each pair of corresponding data values has at least one of a normalized phase angle and magnitude;

adding the first and second complex images;

converting the added images into a human-readable display.

12. The magnetic resonance imaging method as set forth in claim 11 further including correcting the phase angles of the first and second complex images for phase discontinuities.

13. The magnetic resonance imaging method as set forth in claim 12 further including:

fitting the data values of each phase discontinuity corrected complex image to a polynomial to create a pair of complex unitary vector arrays;

multiplying each complex vector array and the data values of the corresponding phase angle corrected complex image together to obtain data values of a phase angle normalized complex image, each phase angle normalized data value having a common, normalized phase angle.

14. The magnetic resonance imaging method as set forth in claim 12 further including:

subtracting the phase angles of each pair of corresponding data values of the first and second complex images to obtain a phase angle difference; and, adjusting a phase angle of one of each pair of corresponding data values of the first and second complex images in accordance with the phase difference such that each pair of corresponding data values of the first and second complex images have a common phase angle value.

15. The magnetic resonance imaging method as set forth in claim 11 further including:

for each pair of corresponding data values of the first and second complex images, addressing a phase angle correction look-up table which is preprogrammed in accordance with phase angle deviations of the first and second coils across the examination region; and rotating the phase angles of at least one of the pair of corresponding data values of the first and second complex image representations in accordance with phase deviation values retrieved from the look-up table.

16. The magnetic resonance imaging method as set forth in claim 11 further including correcting the magnitude value of at least one of each pair of corresponding data values of the first and second complex images.

17. The magnetic resonance imaging method as set forth in claim 16 wherein the magnitude correcting step includes:

retrieving weighting values from a magnitude correction look-up table which is preprogrammed in accordance with magnitude deviations of the first and second coils across the examination region; and adjusting the magnitude values of the first and second complex image representations in accordance with the retrieved weighting values.

* * * * *